United States Patent [19]
Oguri

[11] Patent Number: 6,078,207
[45] Date of Patent: Jun. 20, 2000

[54] OUTPUT AMPLITUDE REGULATING CIRCUIT

[75] Inventor: Takashi Oguri, Tokyo, Japan

[73] Assignee: NEC Corporation, Tokyo, Japan

[21] Appl. No.: 09/159,787

[22] Filed: Sep. 24, 1998

[30] Foreign Application Priority Data

Sep. 26, 1997 [JP] Japan ................................. 9-279532

[51] Int. Cl.[7] ................................ H03K 5/08; H03F 3/45
[52] U.S. Cl. ............................ 327/321; 327/58; 327/319
[58] Field of Search ................................. 327/309, 318, 327/319, 321, 333, 52, 53, 54, 56, 180, 58, 65, 66

[56] References Cited

U.S. PATENT DOCUMENTS

| | | | |
|---|---|---|---|
| 5,063,304 | 11/1991 | Iyengar | 327/310 |
| 5,189,318 | 2/1993 | Tanaka | 327/437 |
| 5,612,611 | 3/1997 | Drouot et al. | 323/223 |
| 5,844,853 | 12/1998 | Kitsukawa et al. | 365/226 |
| 5,926,055 | 7/1999 | Kashmiri et al. | 327/333 |

Primary Examiner—Tuan T. Lam
Assistant Examiner—Terry L. Englund
Attorney, Agent, or Firm—Sughrue, Mion, Zinn, Macpeak & Seas, PLLC

[57] ABSTRACT

An output amplitude regulating circuit comprises a first MOS differential circuit, with a first MOS transistor connected between an output terminal of the first MOS differential circuit and a power supply. The circuit also includes a second MOS differential circuit having a first input terminal that receives a reference electric potential, and a second MOS transistor that is connected between the power supply and a second input terminal of the second MOS differential circuit, and is connected to a reference electric potential via a third MOS transistor and a current source. In the circuit, output terminals of the first and second MOS transistors are used to regulate an output amplitude from the output terminal of the first MOS differential circuit.

7 Claims, 2 Drawing Sheets

601

602

603

6,078,207

OUTPUT AMPLITUDE REGULATING CIRCUIT

FIELD OF THE INVENTION

The present invention relates to a semiconductor integrated circuit, and more particularly to an integrated circuit which includes a differential circuit suitable for a high-speed interface operation.

This application is based on Japanese Patent Application No. Hei 9-279532, the contents of which are incorporated herein by reference.

BACKGROUND ART

In an output buffer circuit between LSIs, especially in a high-speed interface, it is necessary to design and manufacture a circuit to prevent or reduce dependency in output characteristics (especially in delay time) on fluctuation in power supply voltage. One of the main causes of variation in the output characteristics due to the fluctuation in power supply voltage is variation in output amplitude.

While a differential circuit employed in a bipolar semiconductor device is publicly known as an output buffer circuit for a high-speed interface, the problem remains that it is difficult to design the output buffer circuit as a CMOS circuit.

FIG. 3 is a circuitry diagram showing a conventional output buffer circuit employed in a high speed interface. The output buffer circuit includes an N-channel MOS transistor pair 208 and 209 as a differential pair having sources connected in common to one terminal of a current source (constant current source) 304 and gates connected to input terminals 506 and 507, respectively. The current source 304 has the other terminal for receiving a reference electric potential. The circuit further includes a current mirror circuit functioning as an active load for the differential pair, which current mirror circuit includes a P-channel MOS transistor 106 having a drain and a gate connected to a drain of the N-channel MOS transistor 209 and a source connected to a power supply, and a P-channel MOS transistor 105 having a drain connected to a drain of the N-channel MOS transistor 208, a gate connected to the gate of the P-channel MOS transistor 106, and a source connected to the power supply. The drain of the N-channel MOS transistor 208 is connected to an output terminal 508.

In the output buffer circuit, an amplitude of an output voltage at the output terminal 508 varies depending on fluctuation in power supply voltage, and the variation is wide.

There is a problem in that regulation of the output amplitude required for the high-speed interface is impossible in the prior output buffer circuit. The variation in output amplitude shifts signal transition timing (rise and fall time), thus causing difficulties in actualizing the high-speed interface.

SUMMARY OF THE INVENTION

It is therefore an object of the present invention to provide an output buffer circuit which can regulate an output amplitude, reducing dependency on a power supply voltage, and which is suitable for a high-speed interface.

In order to accomplish the above object, an output amplitude regulating circuit according to the present invention comprises: a first MOS differential circuit; a first MOS transistor connected between an output terminal of the first MOS differential circuit and a second power supply; a second MOS differential circuit having a first input terminal being adapted to receive a reference electric potential; and a second MOS transistor connected between the second power supply and a second input terminal of the second MOS differential circuit, and connected to a first power supply via a third MOS transistor and a current source, wherein an output terminal of the second MOS differential circuit is connected to gates of the first and second MOS transistors so as to regulate an output amplitude from the output terminal of the first MOS differential circuit.

According to the present invention, it is possible to provide an output buffer circuit which can regulate an output amplitude, reducing dependency on the power supply voltage. This is because an amplitude regulating circuit for regulating a logic level in the output amplitude is provided with the output buffer.

DETAILED DESCRIPTION OF THE PREFERRED EMBODIMENTS

Figure 1:
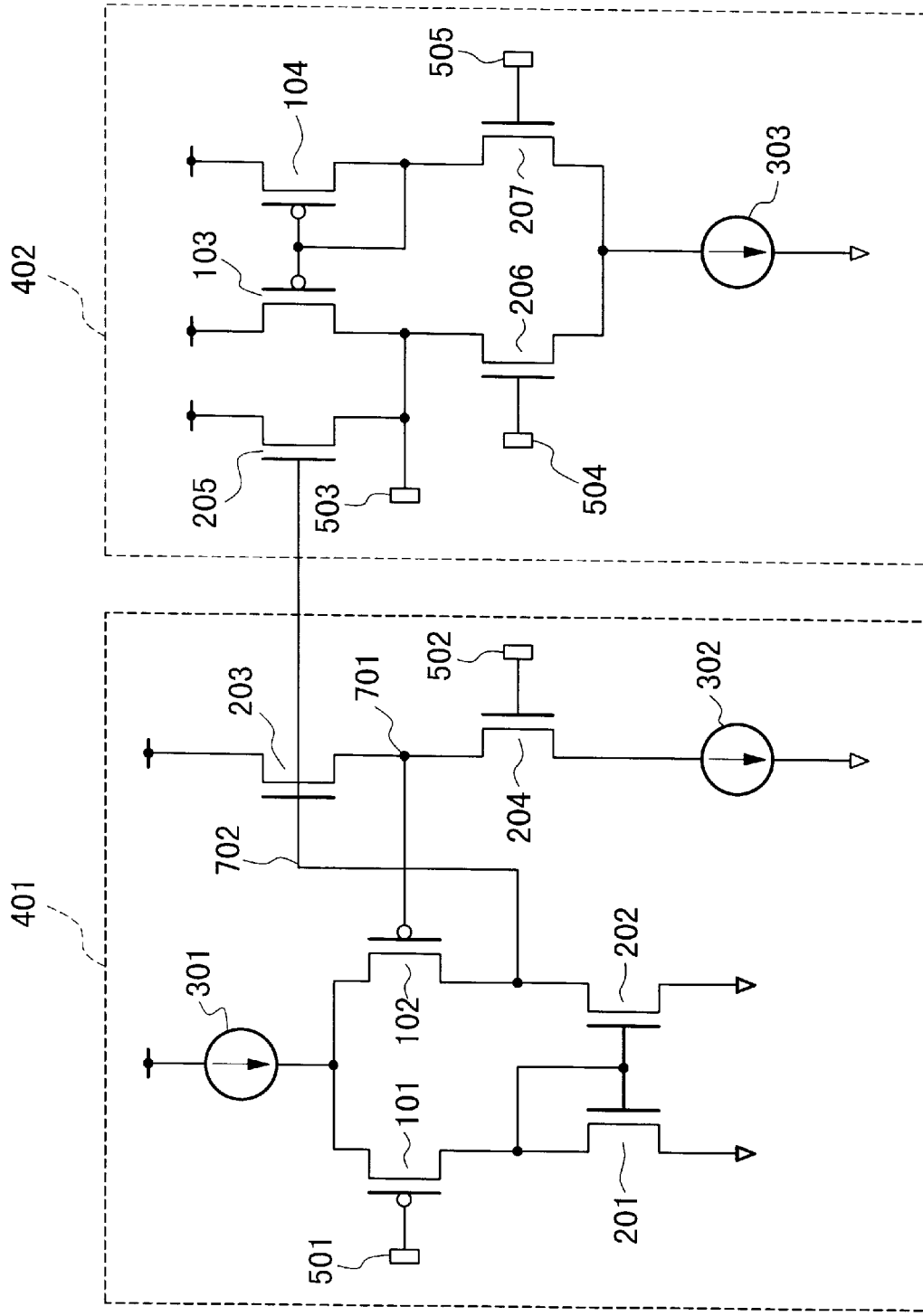
FIG. 1 is a block diagram showing a circuitry construction of an embodiment according to the present invention.

Referring to FIG. 1, the best mode of the output amplitude regulating circuit, according to an embodiment of the present invention, will be explained.

The output amplitude regulating circuit includes a first differential circuit 402, which is comprised of: a first differential pair of MOS transistors 206 and 207 of first conductive-types (N-channel or P-channel) having sources connected to a first power supply via a first current source 303 and gates connected to first input terminals 504 and 505 respectively; a first current mirror circuit of transistors 103 and 104 functioning as an active load for the first differential pair; and a first MOS transistor 205 of the first conductive-type connected between an output terminal 503 of the first differential pair and a second power supply.

The output amplitude regulating circuit further includes an amplitude regulating circuit 401, which is comprised of: a second differential pair of MOS transistors 101 and 102 of the second conductive-type (P-channel or N-channel) having sources connected to the second power supply via a second current source 301 and gates connected to second input terminals, respectively; and a second current mirror circuit of transistors 201 and 202 functioning as an active load for the second differential circuit. Further, a second MOS transistor 203 of the first conductive-type, a third MOS transistor 204 of the first conductive-type, and a third current source 302 are serially connected between the second power supply and the first power supply.

In the amplitude regulating circuit 401, a reference electric potential is input into one second input terminal 501 of the second differential circuit, and the other second input terminal of the second differential circuit is connected to a connection point 701 between the second MOS transistor 203 and the third MOS transistor 204. An output terminal 702 of the second differential circuit is connected to gates of the second MOS transistor 203 and of the first MOS transistor 205. An output voltage is output from a connection point between an output terminal 503 of the first differential pair in the first differential circuit 402 and the first MOS transistor 205.

The embodiment of the present invention will be explained in detail with reference to Figures.

FIG. 1 shows a circuit construction of the embodiment of the present invention. The output buffer circuit of the present invention includes an amplitude regulating circuit 401 and a differential circuit 402. An output from the amplitude regulating circuit 401 is input to a gate of an N-channel MOS transistor 205 which is connected between an output terminal 503 of the differential circuit 402 and a second power supply.

The differential circuit 402 includes a differential pair of an N-channel MOS transistor pair 206 and 207, which have sources connected in common to one terminal of a constant current source 303 whose other terminal is connected to a first power supply, and gates connected to input terminals 504 and 505 respectively. The differential circuit 402 further includes a current mirror circuit, which is comprised of a P-channel MOS transistor 104 which has a drain and a gate connected in common to a drain of the N-channel MOS transistor 207 and a source connected to the second power supply, and a P-channel MOS transistor 103 which has a drain connected to a drain of the N-channel MOS transistor 206, a gate connected to a gate of the P-channel MOS transistor 104, and a source connected to the second power supply. The current mirror circuit functions as an active load for the differential transistor pair 206 and 207. Further, a drain of the N-channel MOS transistor 206 is connected to a source of the N-channel MOS transistor 205 and to an output terminal 503. A drain of the N-channel MOS transistor 205 is connected to the second power supply.

The amplitude regulating circuit 401 includes a differential pair of a P-channel MOS transistor pair 101 and 102, which have sources connected in common to one terminal of a constant current source 301 whose other terminal is connected to the first power supply. The amplitude regulating circuit 401 includes a current mirror circuit, which comprises an N-channel MOS transistor 201 which has a drain and a gate connected in common to a drain of the P-channel MOS transistor 101, and a source connected to the first power supply, and an N-channel MOS transistor 202 which has a drain connected to a drain of the P-channel MOS transistor 102, a gate connected to a gate of the N-channel MOS transistor 201, and a source connected to the first power supply. The current mirror circuit functions as an active load for the differential transistor pair 101 and 102. Further, the amplitude regulating circuit 401 has an N-channel MOS transistor 203 which has a drain connected to the second power supply, a gate connected to a drain of the N-channel MOS transistor 202, and a source connected to a gate of the P-channel MOS transistor 102, and an N-channel MOS transistor 204 which has a drain connected to a source of the N-channel MOS transistor 203, a gate connected to the input terminal 502, and a source connected to one terminal of a constant current source 302 whose other terminal is connected to the first power supply. A gate of the P-channel MOS transistor 101 is connected to an input terminal 501, which is adapted to receive a reference electric potential for regulating the output amplitude, while a drain of the P-channel MOS transistor 102 is connected in common to gates of the N-channel MOS transistors 203 and 205.

Next, an operation of the embodiment according to the present invention will be explained.

By inputting a specified voltage as the reference electric potential 501 of the amplitude regulating circuit 401, an electric potential identical to the reference potential 501 is output as a low level logic at the output terminal 503 of the differential circuit 402. When a complementation signal including a high level logic at the input terminal 504 and a low level logic at the input terminal 505, a low level is output at the output terminal 503.

In the preferred embodiment, the amplitude regulating circuit 401 includes the current source 302, the N-channel MOS transistor 204, and the N-channel MOS transistor 203, which are identical in current value and in size to the current source 303, the N-channel MOS transistor 206, and the N-channel MOS transistor 205 in the differential circuit 402.

An electric potential identical to the low levels at the input terminals 504 and 505 which are complementary in the differential circuit 402 is applied to the input terminal 502 in the amplitude regulating circuit 401. To simplify the construction, the voltage at the source lead of N-MOS transistor 204 may be applied to the input terminal 502. Further, the current values of the current sources and the sizes of the transistors in the amplitude regulating circuit 401 may be multiples of an integer of those in the differential circuit 402.

The nodal point 701 (the source of the N-channel MOS transistor 203) in the amplitude regulating circuit 401 controls an electric potential at the nodal point 702 which is the drain of the N-channel MOS transistor 202 (the output terminal of the current mirror circuit) by means of the current mirror feedback circuit, and corresponds to the reference electric potential 501.

An electric potential identical to the reference electric potential 501 is output as the low level at the output terminal 503 in the differential circuit 402 because the current source 303, the N-channel MOS transistor 206, and the N-channel MOS transistor 205 in the differential circuit 402 are constructed in a fashion similar to the current source 302, the N-channel MOS transistor 204, and the N-channel MOS transistor 203 in the amplitude regulating circuit 401.

Figure 2A:
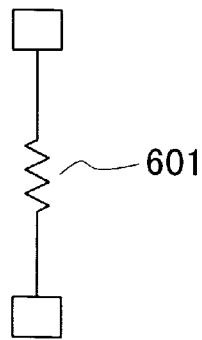
FIGS. 2a to 2c are diagrams showing examples of current sources in the embodiment according to the present invention.
Figure 2B:
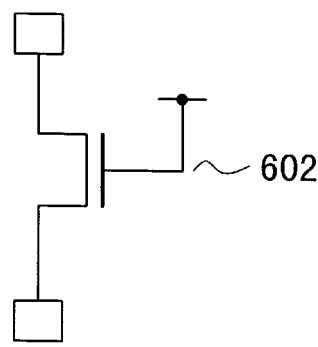
Figure 2C:
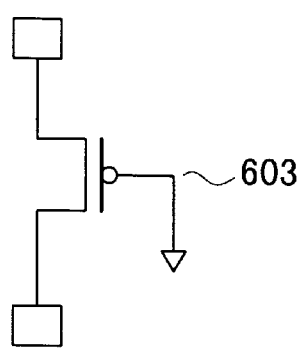
Figure 3:
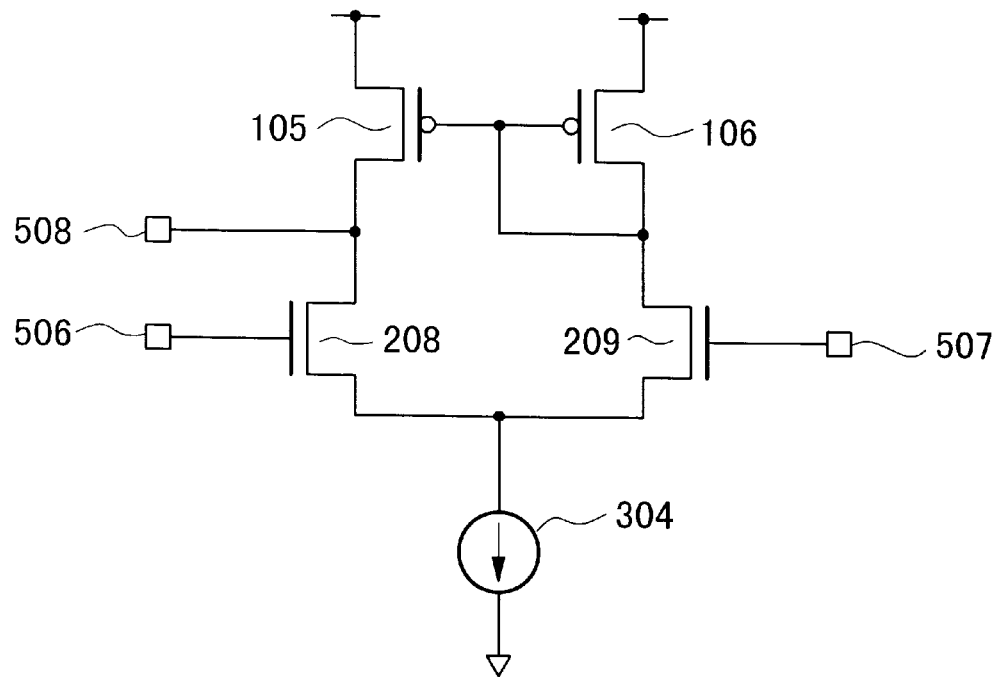
FIG. 3 is a block diagram showing a circuitry construction of an output buffer circuit of the prior art.

FIGS. 2a to 2c show examples of the current sources 301, 302, and 303.

In FIG. 2a, the current source comprises a resistive element 601. In FIG. 2b, the current source comprises an N-channel MOS transistor 602 whose gate is fixed to the power supply electric potential. In FIG. 2c, the current source includes a P-channel MOS transistor 603 whose gate is fixed to the reference electric potential. Although the resistive element 601 is apt to depend on fluctuation in the power supply, the construction is simple and the resistive element 601 is preferable so far as dispersion in a impedance adjustable range is allowed. The MOS transistors 602 and 603 are constructed in a manner simpler than the resistive element 601 and are preferable so far as dispersion in an impedance adjustable range is allowed.

In the circuit in FIG. 1, the same effect is obtained when the polarities of the transistors are reversed, the tops and bottoms are reversed, and the PMOS and the NMOS are exchanged.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An output amplitude regulating circuit comprising:
   a first MOS differential circuit;
   a first MOS transistor connected between an output terminal of said first MOS differential circuit and a power supply;

a second MOS differential circuit having a first input terminal for receiving a reference electric potential; and a second MOS transistor connected between said second power supply and a second input terminal of said second MOS differential circuit, and connected to a first current source via a third MOS transistor, wherein an output terminal of said second MOS differential circuit is connected to gates of said first and second MOS transistors for regulating an output amplitude from said output terminal of said first MOS differential circuit.

2. An output amplitude regulating circuit comprising:

a first differential circuit including a first differential pair of MOS transistors of a first conductivity type, having sources connected to a first power supply via a first current source and gates connected to first input terminals, respectively, a first current mirror circuit functioning as an active load for said first differential pair, and a first MOS transistor of said first conductivity type connected between an output terminal of said first differential pair and a second power supply;

a second differential circuit including a second differential pair of MOS transistors of a second conductivity type having sources connected to said second power supply via a second current source and gates connected to second input terminals of said second differential circuit, respectively, and a second current mirror circuit functioning as an active load for said second differential pair;

a second MOS transistor of said first conductivity type;

a third MOS transistor of said first conductivity type; and a third current source, wherein said second MOS transistor, said third MOS transistor, and said third current source are serially connected between said second power supply and said first power supply, a reference electric potential is input to one of said second input terminals of said second differential circuit, the other second input terminal of said second differential circuit is connected between said second MOS transistor and said third MOS transistor, an output terminal of said second differential circuit is connected to gates of said first MOS transistor and of said second MOS transistor, and an output voltage is output from said output terminal of said first differential pair.

3. An output amplitude regulating circuit according to claim 2, wherein said second MOS transistor, said third MOS transistor, and said third current source are identical to, or a multiple of an integer of said first MOS transistor, one of the MOS transistors in said first differential pair, and said first current source in size and in current value, respectively.

4. An output amplitude regulating circuit comprising an amplitude regulating circuit and a differential circuit, wherein said amplitude regulating circuit comprises:

a first N-channel MOS transistor having a source for receiving a first power supply;

a second N-channel MOS transistor having a source for receiving said first power supply and a gate connected to a gate of said first N-channel MOS transistor;

a first P-channel MOS transistor having a drain connected to a drain and said gate of said first N-channel MOS transistor and a gate connected to a first input terminal of said amplitude regulating circuit;

a second P-channel MOS transistor having a drain connected to a drain of said second N-channel MOS transistor;

a first current source having a first terminal connected to a second power supply and a second terminal connected to a source of said first P-channel MOS transistor and to a source of said second P-channel MOS transistor;

a third N-channel MOS transistor having a drain connected to said second power supply, a gate connected to said drain of said second N-channel MOS transistor, and a source connected to a gate of said second P-channel MOS transistor;

a fourth N-channel MOS transistor having a drain connected to said source of said third N-channel MOS transistor and a gate connected to a second input terminal of said amplitude regulating circuit; and a second current source having a first terminal connected to said first power supply and a second terminal connected to a source of said fourth N-channel MOS transistor; and wherein said differential circuit comprises:

a fifth N-channel MOS transistor having a drain connected to said second power supply, a gate connected to said gate of said third N-channel MOS transistor, and a source connected to a first output terminal;

a third P-channel MOS transistor having a drain connected to said first output terminal, and a source connected to said second power supply;

a fourth P-channel MOS transistor having a drain and a gate connected to a gate of said third P-channel MOS transistor, and a source connected to said second power supply;

a sixth N-channel MOS transistor having a drain connected to said first output terminal, and a gate connected to a third input terminal as one of two differential input terminals;

a seventh N-channel MOS transistor having a drain connected to said drain of said fourth P-channel MOS transistor, and a gate connected to a fourth input terminal as the other differential input terminal; and a third current source having one terminal connected to said first power supply, and the other terminal connected to a source of said sixth N-channel MOS transistor and to a source of said seventh N-channel MOS transistor.

5. An output amplitude regulating circuit according to claim 3, wherein said second current source and said third current source are N-channel MOS transistors.

6. An output amplitude regulating circuit according to claim 3, wherein said second current source and said third current source are resistive elements.

7. An output amplitude regulating circuit according to claim 4, wherein said amplitude regulating circuit has said first input terminal for receiving a reference electric potential.

* * * * *